United States Patent
Zhang

(10) Patent No.: US 9,666,237 B2
(45) Date of Patent: May 30, 2017

(54) MIXED THREE-DIMENSIONAL PRINTED MEMORY

(71) Applicant: ChengDu HaiCun IP Technology LLC, ChengDu (CN)

(72) Inventor: Guobiao Zhang, Corvallis, OR (US)

(73) Assignees: ChengDu HaiCun IP Technology LLC, ChengDu, SiChuan (CN); Guobiao Zhang, Corvallis, OR (US)

( * ) Notice: Subject to any disclaimer, the term of this patent is extended or adjusted under 35 U.S.C. 154(b) by 148 days.

(21) Appl. No.: 14/636,353

(22) Filed: Mar. 3, 2015

(65) Prior Publication Data

US 2015/0294692 A1    Oct. 15, 2015

Related U.S. Application Data

(60) Provisional application No. 61/979,504, filed on Apr. 14, 2014.

(51) Int. Cl.
*G11C 5/02*      (2006.01)
*G11C 8/12*      (2006.01)
*H01L 27/06*     (2006.01)
*H01L 27/112*    (2006.01)

(52) U.S. Cl.
CPC ........... *G11C 5/025* (2013.01); *G11C 8/12* (2013.01); *H01L 27/0688* (2013.01); *H01L 27/1128* (2013.01); *H01L 27/11246* (2013.01); *H01L 2224/32145* (2013.01); *H01L 2224/73265* (2013.01)

(58) Field of Classification Search
CPC ............ H01L 27/1021; H01L 27/112; H01L 27/0688; H01L 27/11246; H01L 27/1128; G11C 11/5692; G11C 17/16; G11C 5/025; G11C 8/12; G11C 5/02
See application file for complete search history.

(56) References Cited

U.S. PATENT DOCUMENTS

| | | |
|---|---|---|
| 4,404,655 A | 9/1983 | Naiff |
| 4,424,579 A | 1/1984 | Roesner |
| 4,598,386 A | 7/1986 | Roesner et al. |
| 4,603,341 A | 7/1986 | Bertin et al. |
| 4,646,266 A | 2/1987 | Ovshinsky et al. |
| 4,796,074 A | 1/1989 | Roesner |
| 4,939,568 A | 7/1990 | Kato et al. |
| 5,257,224 A | 10/1993 | Nojiri et al. |
| 5,272,370 A | 12/1993 | French |
| 5,375,085 A | 12/1994 | Gnade et al. |
| 5,455,435 A | 10/1995 | Fu et al. |
| 5,468,983 A | 11/1995 | Hirase et al. |

(Continued)

OTHER PUBLICATIONS

Arie Tal, Two Technologies Compared: NOR vs. NAND White Paper; Jul. 3, 2003; M-Systems Flash Disk Pioneers, 91-SR-012-04-8L, Rev 1.1.*

(Continued)

*Primary Examiner* — Michael Zarroli

(57) ABSTRACT

The present invention discloses a mixed three-dimensional printed memory (3D-P). The slow contents (e.g., digital books, digital maps, music, movies, and/or videos) are stored in large memory blocks and/or large memory arrays, whereas the fast contents (e.g., operating systems, software, and/or games) are stored in small memory blocks and/or small memory arrays.

9 Claims, 3 Drawing Sheets

(56) References Cited

U.S. PATENT DOCUMENTS

| | | |
|---|---|---|
| 5,721,169 A | 2/1998 | Lee |
| 5,751,012 A | 5/1998 | Wolstenholme et al. |
| 5,825,686 A | 10/1998 | Schmitt-Landsiedel et al. |
| 5,835,396 A | 11/1998 | Zhang |
| 5,838,530 A | 11/1998 | Zhang |
| 5,841,150 A | 11/1998 | Gonzalez et al. |
| 5,843,824 A | 12/1998 | Chou et al. |
| 5,847,442 A | 12/1998 | Mills, Jr. et al. |
| 5,854,111 A | 12/1998 | Wen |
| 5,904,526 A | 5/1999 | Wen et al. |
| 5,907,778 A | 5/1999 | Chou et al. |
| 5,943,255 A | 8/1999 | Kutter et al. |
| 6,015,738 A | 1/2000 | Levy et al. |
| 6,021,079 A | 2/2000 | Worley |
| 6,034,882 A | 3/2000 | Johnson et al. |
| 6,049,481 A | 4/2000 | Yamasaki |
| 6,055,180 A | 4/2000 | Gudesen et al. |
| 6,185,122 B1 | 2/2001 | Johnson et al. |
| 6,221,723 B1 | 4/2001 | Kunitou |
| 6,236,587 B1 | 5/2001 | Gudesen et al. |
| 6,380,597 B1 | 4/2002 | Gudesen et al. |
| 6,385,074 B1 | 5/2002 | Johnson et al. |
| 6,515,888 B2 | 2/2003 | Johnson et al. |
| 6,624,485 B2 | 9/2003 | Johnson |
| 6,765,813 B2 * | 7/2004 | Scheuerlein ........... G11C 5/025 365/51 |
| 6,794,253 B2 | 9/2004 | Lin et al. |
| 7,952,904 B2 | 5/2011 | Zhang |
| 8,120,959 B2 * | 2/2012 | Lee ..................... G11C 8/12 365/185.13 |
| 2007/0100852 A1 * | 5/2007 | Wang .................... G06F 3/0611 |
| 2013/0215683 A1 * | 8/2013 | Lee .................... G11C 16/0466 365/185.29 |

OTHER PUBLICATIONS

Spence et al. "Mask Data Volume—Historical Perspective and Future Requirements".

* cited by examiner

MIXED THREE-DIMENSIONAL PRINTED MEMORY

CROSS-REFERENCE TO RELATED APPLICATIONS

This claims benefit of a provisional application, "Three-Dimensional Printed Memory with Mixed Memory Arrays", Application Ser. No. 61/979,504, filed Apr. 14, 2014.

BACKGROUND

1. Technical Field of the Invention

The present invention relates to the field of integrated circuit, and more particularly to three-dimensional printed memory (3D-P).

2. Prior Arts

Three-dimensional printed memory (3D-P), also known as three-dimensional mask-programmed read-only memory (3D-MPROM), is a monolithic semiconductor memory comprising a plurality of vertically stacked memory levels. U.S. Pat. No. 5,835,396 issued to Zhang on Nov. 3, 1998 discloses a 3D-P (3D-MPROM). It comprises a substrate level OK and a plurality of vertically stacked memory levels 10, 20 (FIG. 1A). The substrate level OK comprises decoders 14, 24 for the memory levels 10, 20. It is covered by a planarized insulating dielectric 0d. A first memory level 10 is stacked above the insulating dielectric 0d, and a second memory level 20 is stacked above the first memory level 10. The first memory level 10 is coupled to the substrate circuit OK through contact vias 13a, while the second memory level 20 is coupled to the substrate circuit OK through contact vias 23a.

Each of the memory levels (e.g. 10, 20) comprises at least a memory array (e.g. 100A, 200A). Each memory array (e.g. 100A) comprises a plurality of upper address-select lines (i.e. y-lines, e.g. 12a-12d, 22a-22d), lower address-select lines (i.e. x-lines, e.g. 11a, 21a) and memory devices (e.g. 1aa-1ad, 2aa-2ad) at the intersections between the upper and lower address lines. A memory array 100A is a collection of memory devices (e.g. 1aa-1ad, 2aa-2ad) in a memory level 10 that share at least one address-select line (e.g. 11a, 12a-12d). Within a memory array (e.g. 100A), all address-select lines (e.g. 11a, 12a-12d) are continuous; between adjacent memory arrays, address-select lines are not continuous.

A 3D-P die 1000 comprises a plurality of the memory blocks (e.g. 1aa, 1ab ... 1dd) (FIG. 1B). The structure shown in FIG. 1A is part of the memory block 1aa. A memory block 1aa is a portion of the 3D-P die 100 whose topmost memory level 20 comprises only a single memory array 200A. Within the topmost memory level 20 of the memory block 1aa, all address-select lines 21a, 22a-22d are continuous and terminate at or near the edge of the memory block 1aa. In prior-art 3D-P, all memory blocks (e.g. 1aa-1dd) in a 3D-P die 1000 have the same size; and, within each memory block 100, the memory arrays (e.g. 100A, 200A) in all memory levels (e.g. 10, 20) have the same size.

As the storage capacity of a 3D-P increases (a single 3D-P die can store up to 1 Tb), more contents can be stored therein, including slow contents that do not require fast access (e.g., digital books, digital maps, music, movies, and/or videos) and fast contents that require fast access (e.g., operating systems, software, and/or games). Prior arts integrate these contents into a single 3D-P die with memory blocks and memory arrays of same sizes. This causes several problems. If the memory array is made too small, poor array efficiency leads to a higher die cost. On the other hand, if the memory array is made too large, slow memory speed may not meet the speed requirement of fast contents.

OBJECTS AND ADVANTAGES

It is a principle object of the present invention to provide a three-dimensional printed memory (3D-P) with an optimized array efficiency and memory speed.

In accordance with these and other objects of the present invention, a mixed 3D-P is disclosed.

SUMMARY OF THE INVENTION

The present invention discloses a mixed three-dimensional printed memory (3D-P). It takes full advantage of the fact that the contents to be stored in the 3D-P are already known. Thus, the sizes of memory blocks and memory arrays can be adjusted according to the speed requirement of each individual content. The slow contents (i.e., contents that do not require fast access, e.g., digital books, digital maps, music, movies, and/or videos) are stored in large memory blocks and/or large memory arrays, whereas the fast contents (i.e., contents that require fast access, e.g., operating systems, software, and/or games) are stored in small memory block and/or small memory arrays. In one preferred embodiment, the memory blocks with different sizes can be formed side-by-side. In another preferred embodiment, a plurality of small side-by-side memory arrays are formed underneath a single large memory array.

Figure 1A:
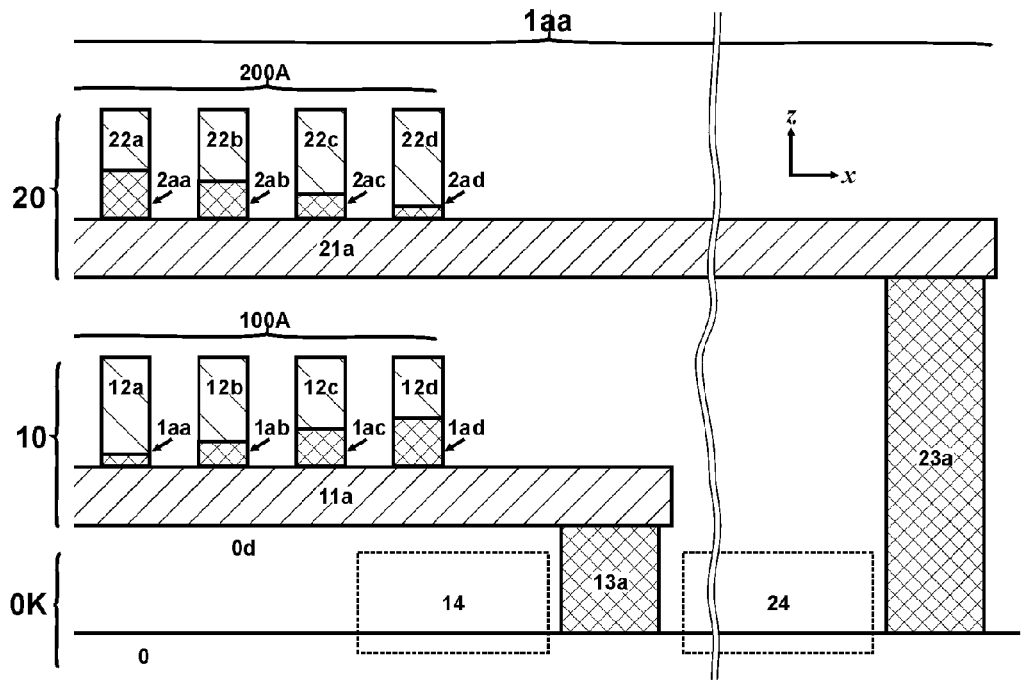
FIG. 1A is a cross-sectional view of a prior-art three-dimensional printed memory (3D-P)
Figure 1B:
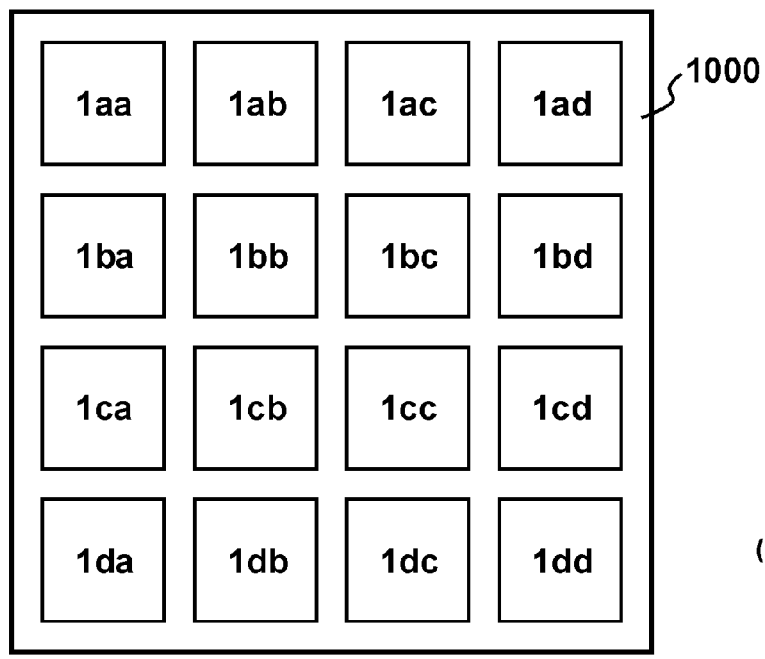
FIG. 1B is a die diagram of a prior-art 3D-P.

It should be noted that all the drawings are schematic and not drawn to scale. Relative dimensions and proportions of parts of the device structures in the figures have been shown exaggerated or reduced in size for the sake of clarity and convenience in the drawings. The same reference symbols are generally used to refer to corresponding or similar features in the different embodiments.

DETAILED DESCRIPTION OF THE PREFERRED EMBODIMENTS

Those of ordinary skills in the art will realize that the following description of the present invention is illustrative only and is not intended to be in any way limiting. Other embodiments of the invention will readily suggest themselves to such skilled persons from an examination of the within disclosure.

Figure 2:
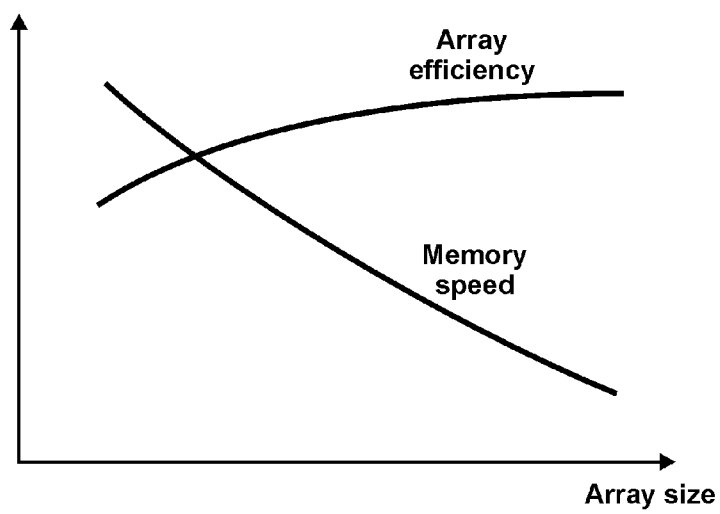
FIG. 2 illustrates the relationship between the array efficiency, the memory speed and the array size.

Referring now to FIG. 2, the relationships between the array efficiency, the memory speed and the array size are disclosed. When the memory arrays are small, because the peripheral circuit of each memory array has a fixed size, the array efficiency degrades. As the memory arrays become larger, the array efficiency improves. However, as the parasitic capacitance and resistance increase, the access speed suffers.

The preferred mixed 3D-P takes full advantage of the fact that the contents to be stored in the 3D-P are already known. Thus, the sizes of memory blocks and memory arrays can be adjusted according to the speed requirement of each individual content. The slow contents (i.e., contents that do not require fast access, e.g., digital books, digital maps, music, movies, and/or videos) are stored in large memory blocks and/or large memory arrays, whereas the fast contents (i.e., contents that require fast access, e.g., operating systems, software, and/or games) are stored in small memory block and/or small memory arrays.

Figure 3:
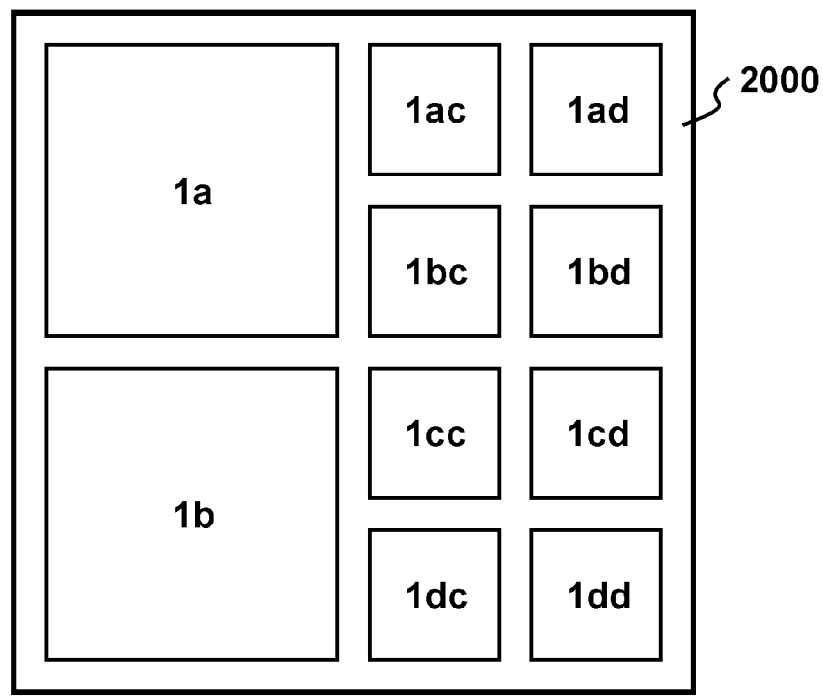
FIG. 3 is a die diagram of a first preferred 3D-P with mixed memory blocks.

Referring now to FIG. 3, a first preferred 3D-P with mixed memory blocks is shown. This 3D-P die 2000 comprises a plurality of memory blocks 1a, 1b, 1ac-1dd. The memory blocks 1a, 1b contain larger memory arrays than those in memory blocks 1ac-1dd. As such, the memory blocks 1a,1b can be used to store slow contents, e.g., digital books, digital maps, music, movies, and/or videos, whereas the memory blocks 1ac-1dd can be used to store fast contents, e.g., operating systems, software, and/or games.

Figure 4:
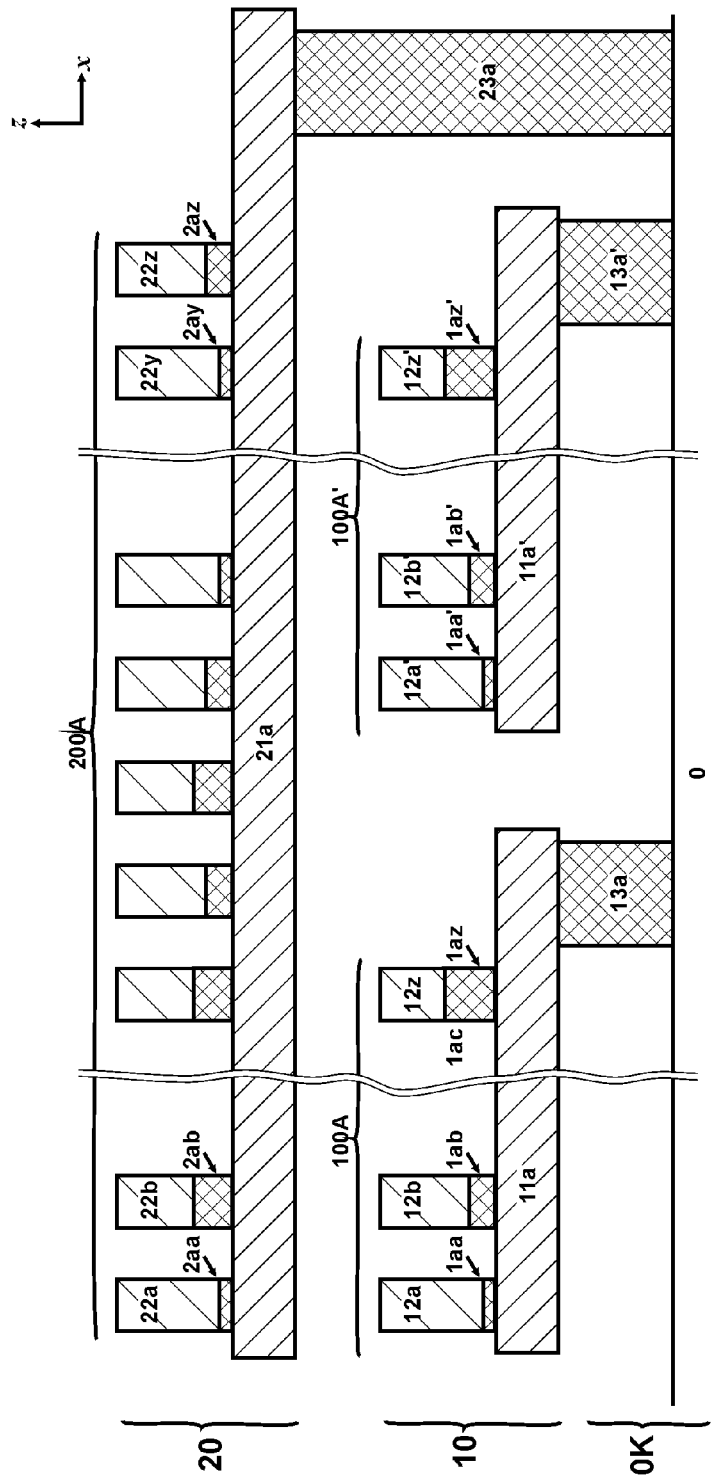
FIG. 4 is a cross-sectional view of a second preferred 3D-P with mixed memory arrays.

Referring now to FIG. 4, a second preferred 3D-P with mixed memory arrays is shown. This preferred 3D-P comprises two memory levels 10, 20 with the memory level 20 stacked above the memory level 10. The memory level 20 comprises a single memory array 200A, while the memory level 10 comprises two side-by-side memory arrays 100A, 100A'. Apparently, the memory array 200A in the memory level 20 is much larger than the memory arrays 100A, 100A' in the memory level 10. The memory array 200A can be used to store slow contents, e.g., digital books, digital maps, music, movies, and/or videos, whereas the memory arrays 100A, 100A' can be used to store fast contents, e.g., operating systems, software, and/or games.

While illustrative embodiments have been shown and described, it would be apparent to those skilled in the art that may more modifications than that have been mentioned above are possible without departing from the inventive concepts set forth therein. The invention, therefore, is not to be limited except in the spirit of the appended claims.

What is claimed is:

1. A mixed three-dimensional printed memory (3D-P) comprising a plurality of memory blocks including a 3D-P block, wherein:
   said 3D-P block comprises a plurality of vertically stacked memory levels including a topmost memory level, wherein said topmost memory level is the topmost memory level among all of said memory levels;
   said 3D-P block comprises a first memory array in said topmost memory level;
   said 3D-P block further comprises at least second and third memory arrays in a memory level below said topmost memory level, wherein said second and third memory arrays are located on a same memory level and do not share any address-select line;
   said first memory array fully covers both said second and third memory arrays.

2. The memory according to claim 1, wherein said first memory array stores digital books.

3. The memory according to claim 1, wherein said first memory array stores digital maps.

4. The memory according to claim 1, wherein said first memory array stores music.

5. The memory according to claim 1, wherein said first memory array stores movies.

6. The memory according to claim 1, wherein said first memory array stores videos.

7. The memory according to claim 1, wherein said second or third memory array stores operating system.

8. The memory according to claim 1, wherein said second or third memory array stores software.

9. The memory according to claim 1, wherein said second or third memory array stores games.

* * * * *